United States Patent [19]

Susak et al.

[11] Patent Number: 4,717,885
[45] Date of Patent: Jan. 5, 1988

[54] OPERATIONAL AMPLIFIER UTILIZING FET FOLLOWERS AND FEED-FORWARD CAPACITORS

[75] Inventors: David M. Susak, Mesa; Robert L. Vyne, Tempe, both of Ariz.

[73] Assignee: Motorola, Inc., Schaumburg, Ill.

[21] Appl. No.: 909,808

[22] Filed: Sep. 22, 1986

[51] Int. Cl.$^4$ .............................................. H03F 3/45
[52] U.S. Cl. .................................... 330/151; 330/253
[58] Field of Search ................... 330/76, 78, 151, 156, 330/253, 277, 292, 300

[56] References Cited

U.S. PATENT DOCUMENTS

| | | | |
|---|---|---|---|
| 3,379,987 | 4/1968 | Volkers | 330/300 X |
| 3,562,656 | 2/1971 | Bateman | 330/151 X |
| 3,987,369 | 10/1976 | Yokoyama | 330/253 |
| 4,241,314 | 12/1980 | Iwamatsu | 330/253 |
| 4,390,852 | 6/1983 | Addis | 330/300 |

Primary Examiner—James B. Mullins
Attorney, Agent, or Firm—Vincent B. Ingrassia

[57] ABSTRACT

An improved field effect transistor follower circuit includes a transistor having equivalent input capacitance $C_\pi$ and a field-effect-transistor which has a gate electrode coupled to a source of an input signal, a drain coupled to a source of supply voltage, and a source coupled to the base of the transistor. A feed forward capacitor is provided and coupled between the gate and source electrodes of the field effect transistor. An operational amplifier is also disclosed which utilizes junction field-effect-transistor followers including feed forward capacitors.

4 Claims, 2 Drawing Figures

OPERATIONAL AMPLIFIER UTILIZING FET FOLLOWERS AND FEED-FORWARD CAPACITORS

BACKGROUND OF THE INVENTION

This invention relates generally to improved follower circuits and, more particularly, to an operational amplifier utilizing FET followers and feed-forward capacitors to improve frequency performance, slew rate, and enhance gain-bandwidth product (GBP).

It is well known that field-effect-transistor (FET) followers, in particular junction field-effect-transistor (JFET) followers have poor frequency response at low operating currents (e.g. $\leq 100$ $\mu$A) due to their low transconductance ($g_m$). For example, in one known operational amplifier circuit, the base terminals of a PNP differential pair are each coupled to the source of a JFET follower. The high dynamic resistance ($1/g_m$) of the JFET follower forms a pole with the equivalent input capacitance ($C_\pi$) of the PNP transistor. The result is a JFET amplifier having poor frequency performance; e.g. 45 degrees of excess phase shift at 800 KHz. Notwithstanding, the use of JFETs as input devices is desirable since they require a significantly smaller input bias current.

SUMMARY OF THE INVENTION

It is an object of the present invention to provide an operational amplifier utilizing JFET input devices and having improved frequency performance.

It is a further object of the present invention to provide an improved FET follower circuit.

It is a still further object of the present invention to provide a JFET operational amplifier circuit having an enhanced gain bandwidth product.

Yet another object of the present invention is to provide a JFET operational amplifier having improved slew rate.

According to a broad aspect of the invention there is provided an improved field effect transistor follower circuit, comprising transistor means having a control electrode and characterized by an equivalent input capacitance $C_\pi$; a first field-effect-transistor having a gate electrode for coupling to a source of an input signal, a first current conducting electrode for coupling to a first potential, and a second current conducting electrode for coupling to a second potential and coupled to said control electrode; and a capacitor $C_F$ coupled between said gate electrode and said second current conducting electrode.

According to a further aspect of the invention there is provided an improved operational amplifier circuit of the type wherein there is provided first and second emitter coupled transistors each characterized by an equivalent input capacitance $C_\pi$, each of said first and second transistors having a collector electrode coupled to a current mirror circuit, and each having a base electrode, the improvement comprising first and second input circuits coupled respectively to the base electrodes of said first and second transistors, each input circuit including a first field effect transistor having a gate electrode for coupling to a source of an input potential, a first current conducting electrode for coupling to a first potential, and a second current conducting electrode for coupling to a second potential; and a capacitor $C_F$ coupled between said gate electrode and said second current conducting electrode.

The above and other objects, features and advantages of the present invention will be more clearly understood from the following detailed description taken in conjunction with the accompanying drawings, in which:

DESCRIPTION OF THE PREFERRED EMBODIMENT

Figure 1:
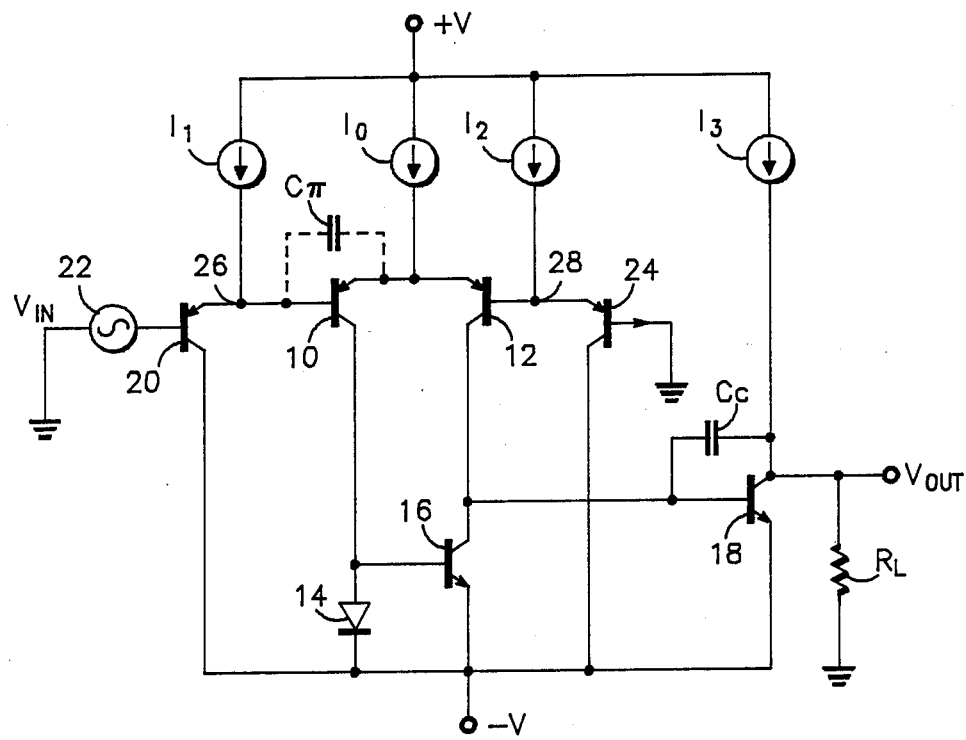
FIG. 1 is a schematic diagram of an operational amplifier.

FIG. 1 is a schematic diagram of a typical JFET operational amplifier. As can be seen, an emitter coupled differential pair of PNP transistors (10 and 12) have their collector electrodes coupled to a current mirror circuit comprised of diode 14 and NPN transistor 16. That is, the collector of transistor 10 is coupled to the anode of diode 14 and to the base of transistor 16. The collector of transistor 12 is coupled to the collector of transistor 16 and to the base of output NPN transistor 18. Both the cathode of diode 14 and the emitter of transistor 16 are coupled to a source of supply voltage ($-V$). Current source $I_0$ is coupled between a source of supply voltage ($+V$) and the emitters of transistors 10 and 12 for the purpose of supplying current thereto.

The base electrode of transistor 10 is coupled to the source of follower JFET 20 which in turn has a drain coupled to $-V$. The gate electrode of JFET 20 is coupled to a source of an input signal ($V_{IN}$) 22. In a similar manner, the base of transistor 12 is coupled to the source of follower JFET 24 which likewise has a drain coupled to $-V$. The gate of JFET 24 may be coupled to ground. A current source $I_1$ is coupled between $+V$ and node 26, and current source $I_2$ is coupled between $+V$ and node 28.

Finally, output transistor 18 has a collector coupled to $+V$ via current source $I_3$ and an emitter coupled to $-V$. Compensation capacitor $C_c$ is coupled across the base-collector terminals of transistor 18. The output of the circuit ($V_0$) is taken from the collector of transistor 18 and drives a load $R_L$.

The operational amplifier FIG. 1 operates in the well known manner. That is, when the gate of JFET 20 goes low with respect to the gate of JFET 24, the base of transistor 10 will go low with respect to the base of transistor 12 causing transistor 10 to turn on and conduct more current than transistor 12. Through the action of the current mirror circuit, the voltage at the base of output transistor 18 will fall maintaining transistor 18 in an off condition which in turn causes $V_0$ to be high. Should, on the other hand, the gate of JFET 20 become high with respect to the gate of JFET 24, the voltage at the base of transistor 10 will be high with respect to that at the base of transistor 12 causing transistor 12 to turn on harder than transistor 10. In this case, the voltage at the base of transistor 18 will rise causing transistor 18 to turn on bringing its collector voltage and therefore the output voltage ($V_0$) down. For the sake of example, transistors 10 and 12 may have a base width of 10 microns, $I_1$ and $I_2$ may equal approximately 100 microamps, and $I_0$ may equal 200 microamps.

As stated previously, the frequency response of the circuit shown in FIG. 1 is poor due to the low transconductance ($gm_f$) of JFET 20 which is driving the equivalent input capacitance $C_\pi$ of PNP transistor 10. This causes a pole to be produced at $$\omega_p = -gm_f/C_\pi. \tag{1}$$

where $1/gm_f < < R_\pi$.

As a result, the amplifier shown in FIG. 1 has poor phase performance; i.e. 45 degrees of excess phase shift at 800 KHz, with a unity gain crossover frequency of 2 MHz.

Figure 2:
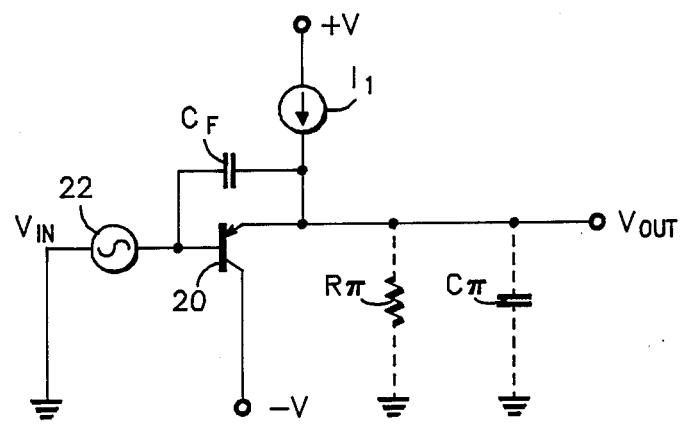
FIG. 2 is a schematic diagram of an improved JFET follower circuit in accordance with the present invention.

Referring now to the schematic diagram in FIG. 2 where PNP transistor 10 is now represented only by its equivalent input capacitance $C_\pi$ and equivalent input resistance $R_\pi$, it can be seen that a feed forward capacitor $C_F$ has been placed across the gate and source electrodes of JFET 20. This significantly increases the frequency performance of the follower since it creates a zero to cancel the pole $\omega_p$ as shown below. Assuming that $R_\pi$ is much greater than $1/g_m$ of JFET 20, the transfer function from $V_{IN}$ to $V_0$ is as follows $$(V_{IN} - V_O)sC_F + g_m(V_{IN} - V_O) = V_O s C_\pi \tag{2}$$

$$V_{IN}(sC_F + g_m) = V_O(sC_\pi + sC_F = g_m) \tag{3}$$

$$\frac{V_O}{V_{IN}} = \frac{sC_F + g_m}{sC_\pi + sC_F + g_m} \tag{4}$$

Thus, a zero is created at $$\omega_z = -g_m/C_F \tag{5}$$

and a pole is created at $$\omega_p = -gm/(C_\pi + C_F) \tag{6}$$

With $C_F$ at approximately 100 picofarads, it is substantially greater than $C_\pi$ and therefore pole zero cancellation occurs. Now, the phase margin is 45 degrees at 20 MHz instead of 800 KHz, and the unity gain frequency is 6 MHz instead of 2.8 MHz. Thus, the frequency performance has been substantially improved.

Ignoring for the time being JFETs 20 and 24 and current sources $I_1$ and $I_2$, and assuming that compensation capacitor $C_c$ is approximately 49 picofarads, the remaining PNP amplifier circuit would exhibit a bandwidth of 10 MHz and a slew rate of approximately 4.1 volts per microsecond with $I_0 = 200 \mu A$ and the inthrinsic PNP emitter resistance at 65 ohms. The circuit has a single pole roll off and exhibits a phase margin of approximately 58 degrees at 10 MHz. By now including JFETS 20 and 24 and feed forward capacitors of approximately 15 picofarads, the unity gain frequency is reduced to approximately 3.5 MHz but the gain bandwidth product at one hundred KHz remains the same (i.e. 10 MHz). The phase margin at 10 MHz remains substantially unchanged. Thus, the JFET followers 20 and 24 operating in conjunction with feedforward capacitors can act as high frequency attenuators; i.e. the gain is attenuated at 10 MHz (depending on the value of $C_F$) but not 100 KHz. Since the JFET followers attenuate the signal or reduce the gain near 10 MHz, compensation capacitor ($C_c$) could be reduced to approximately 15 picofarads to obtain the same 10 MHz unity gain frequency. By reducing the capacitance of the compensation capacitor and maintaining the 10 MHz unity gain frequency, the slew rate and the GBP (at 100 KHz) increases dramatically.

It should be apparent from equations 5 and 6, that by properly choosing $C_F$, a doublet may be generated. Since the pole occurs first, the boost in gain bandwidth product is proportional to the number of octaves between the pole and the zero. By using a capacitor $C_F$ and causing $C_\pi$ to be large (as by running large PNP currents or shunting $C_\pi$ with an external capacitor or widening the PNP basewidths) $\omega_p$ and $\omega_z$ may be separated by many octaves. Therefore, the boost in gain at frequencies well above the dominant pole frequency is $$GBP_{BOOST} = 20 \log \frac{C_\pi + C_F}{C_F} \tag{7}$$

In addition, since the slew rate is equal to the tail current $I_0$ divided by the capacitance of compensation capacitor $C_c$, the slew rate has now been increased to 13.3 volts per microsecond in this example.

In conclusion, the use of FET followers as high frequency attenuators in conjunction with feed forward capacitors permits smaller compensation capacitors to be used for the same $I_0$ resulting in a higher gain bandwidth product and faster slew rate.

The above description is given by way of example only. Changes in form and details may be made by one skilled in the art without departing from the scope of the invention as defined by the appended claims.

We claim:

1. An improved operational amplifier circuit of the type wherein there is provided first and second emitter coupled transistors each characterized by an equivalent input capacitance $C_\pi$, each of said first and second transistors having a collector electrode coupled to a load, and each having a base electrode, the improvement comprising:

first and second input circuits coupled respectively to the base electrodes of said first and second transistors, each input circuit including:
   a first field effect transistor having a gate electrode for coupling to a source of an input potential, a first current conducting electrode for coupling to a first potential, and a second current conducting electrode for coupling to a second potential; and
   a capacitor $C_F$ connected directly between said gate electrode and said second current conducting electrode.

2. An operational amplifier according to claim 1 wherein each of said emitter coupled transistors is a PNP transistor.

3. An operational amplifier according to claim 2 wherein said field effect transistor is a junction field effect transistor.

4. An operational amplifier according to claim 3 wherein $C_F$ is substantially greater than $C_\pi$.

* * * * *